United States Patent [19]

Uren et al.

[11] 4,357,575

[45] Nov. 2, 1982

[54] APPARATUS FOR USE IN TESTING PRINTED CIRCUIT PROCESS BOARDS HAVING MEANS FOR POSITIONING SUCH BOARDS IN PROPER JUXTAPOSITION WITH ELECTRICAL CONTACTING ASSEMBLIES

[75] Inventors: Delbert L. Uren; Forrest L. Thompson, both of Kansas City, MO

[73] Assignee: DIT-MCO International Corporation, Kansas City, Mo.

[21] Appl. No.: 160,291

[22] Filed: Jun. 17, 1980

[51] Int. Cl.³ .................... G01R 31/02; H01R 13/24
[52] U.S. Cl. ............................ 324/158 F; 269/903; 324/73 PC; 339/65
[58] Field of Search .......... 324/73 PC; 158 P, 158 F; 269/903, 1; 279/1 L; 339/64 R, 64 M, 65, 66 R, 66 M, 66 T

[56] References Cited

U.S. PATENT DOCUMENTS

| | | | |
|---|---|---|---|
| 3,728,667 | 4/1923 | Richelmann | 324/158 F X |
| 3,824,462 | 7/1974 | Vinsani | 324/73 PC |
| 4,012,693 | 3/1977 | Sullivan | 324/73 PC |
| 4,038,599 | 7/1977 | Bove et al. | 324/158 F |

FOREIGN PATENT DOCUMENTS 112690  3/1979  Japan .............................. 324/158 F

OTHER PUBLICATIONS

Cefarelli et al., *Test Connector*, IBM Technical Disclosure Bulletin vol. 19, No. 9, Feb. 1977, pp. 3508, 3509.
Schenone, F. E. *Transistor Socket*, IBM Tech. Discl. Bull., vol. 3, No. 10, Mar. 1961, p. 66.

*Primary Examiner*—Gerard R. Strecker
*Attorney, Agent, or Firm*—Schmidt, Johnson, Hovey & Williams

[57] ABSTRACT

Improved testing fixture apparatus for use in accurately effecting temporary electrical connections with the test point zones of printed circuit boards or the like is provided in which the board to be tested is mounted upon a locator assembly that is shiftably receivable within the fixture and includes a centering and gripping mechanism operative in conjunction with a cooperative part carried by the contact bearing portion of the fixture for automatically positioning the locator assembly and printed circuit board carried by the latter in a predetermined location within the fixture assuring precise alignment of a contact with each of the test point zones of the printed circuit board to be tested. The positioning action of the mechanism and its cooperating part includes both a centering function and a gripping function therebetween, and both of such functions occur automatically in response to relative shifting of the portions of the fixture for respectively supporting the printed circuit board and the contacts toward each other into an operative relationship for effecting electrical connections between the test point zones of the printed circuit board and corresponding contacts of the fixture.

6 Claims, 5 Drawing Figures

APPARATUS FOR USE IN TESTING PRINTED CIRCUIT PROCESS BOARDS HAVING MEANS FOR POSITIONING SUCH BOARDS IN PROPER JUXTAPOSITION WITH ELECTRICAL CONTACTING ASSEMBLIES

BACKGROUND OF THE INVENTION

1. Field of the Invention

This invention relates to apparatus for use in testing printed circuit boards or similar devices and, more particularly, to an improved means of supporting a printed circuit board or similar device in a predetermined location within a fixture utilised to effect electrical connections with the test point zones of the device. The improvement extends both to assuring better alignment between the individual contacts of an array of some carried by the fixture with the test point zones of the device to be tested and to facilitating the introduction of successive devices to be tested into the fixture.

2. Description of the Prior Art

The type of fixtures commonly employed in the testing of printed circuit boards or the like employ a pair of relatively shiftable supports, one typically in the nature of a base and the other in the nature of a head mounted for reciprocation toward and away from the base, with one of such supports carrying a matrix of electrical contacts having electrical leads associated therewith for coupling with external electrical testing equipment, while the other support is adapted to receive a succession of printed circuit boards to be tested in a position such that each of the test point zones of the printed circuit board under test will be aligned with a corresponding one of the contacts carried by the other support, so that each test point zone will be properly engaged by a corresponding contact to effect a temporary electrical connection therebetween when the two supports provided by the fixture are relatively shifted toward each other into an operative relationship thereof.

Since the individual test zones of a printed circuit board are relatively small and frequently relatively closely spaced, and since the contacts are also relatively closely spaced, it has long been a problem to assure sufficiently precise alignment between the respective test point zones of the device under test and the corresponding contacts provided in the fixture for engaging such zones. With older types of printed circuit boards and fixtures for use in effecting electrical connections with the test point zones thereof during testing, it was commonly regarded as sufficient merely to define a predetermined location for the device to be tested upon one of the support portions of the fixture by means of locating pins, stop blocks or the like rigidly secured to that support portion of the fixture, while taking reasonable pains in the construction of the fixture to assure that the path along which the support portions of the fixture would be relatively shifted toward their operative relationship for bringing a contact into engagement with each of the test point zones of the device under test would be relatively free from substantial lateral deviation.

In the testing of printed circuit boards of the complexity and degree of miniaturization that has now become typical, however, it is not unusual to employ matrix arrangements of contacts spaced on 0.05 inch centers, and a lateral deviation from precise alignment between individual contacts and corresponding test point zones of the device under test of as little as one or two thousandths of an inch from perfect alignment between all of the multitudinous test point zones of the device and the intended corresponding contacts can be sufficient to prevent the electrical connections required for satisfactory testing from being accomplished. Although in theory it would be possible to so construct the fixtures that the relative movement between the two support portions thereof would be constrained to linearity within a tighter tolerance than that mentioned, the expense involved in fabricating and maintaining such fixtures creates a geat need for a better solution to the problem. It may also be noted in passing that, when similarly tight tolerances must be held between the printed circuit board under test and locating pins or blocks rigidly secured to one of the support portions of the fixture within the confines of the latter, the emplacement and removal of successive printed circuit boards to be tested is necessarily also rendered more difficult and time consuming.

One of the more recent approaches to coping with the tighter alignment tolerances now required in the testing of printed circuit boards of modern type has involved the provision of elongate alignment pins fixedly mounted on the support portion of the fixture that will hold the printed circuit board being tested, by means of fitting locating holes in the board over such pins, and with a distal portion of such pins being precisely tapered and adapted to be received within corresponding holes in the other support portion of the fixture. Although such last-mentioned technique has been reasonably satisfactory in assuring relatively precise location of the printed circuit board being tested upon one of the support portions of the fixture and also in providing a means independent of the involved primary guide structures for urging the two support portions of the fixture into predetermined alignment as they are relatively shifted into their operative relationship for ffeecting the electrical connections required for testing, such approach to the problem has inherently involved certain practical disadvantages, including the sizes and types of parts requiring precision machining initially and frequent replacement as wear occurs, as well as imposing serious limitations upon the speed and convenience of emplacement and removal of successive printed circuit boards to be tested within a fixture that is so constructed.

SUMMARY OF THE INVENTION

Accordingly, it is the primary object of this invention to provide an improved construction for the apparatus to be employed in effecting temporary electrical connections with printed circuit boards to be successively tested, which will overcome the disadvantages inherent in prior approaches to the construction of such apparatus, and will do so through the employment of an improved construction that is reliable, relatively inexpensive to fabricate, of nature tending to automatically compensate for wear, and utilizes locator assemblies that are removable from the fixture and interchangeable to permit mounting of the printed circuit boards to be tested on the locator assemblies outside of the fixture and convenient emplacement within the fixture of such locator assemblies preloaded with successive printed circuit boards to be tested.

The improved apparatus contemplated by the invention employs locator assemblies for carrying the printed circuit boards to be tested which are not rigidly attached to the support portion of the fixture upon which they will be emplaced, but rather are shiftably received in slideable relationship to a surface of that portion of the fixture, with such locator assemblies being provided with mechanisms for receiving and automatically gripping in a centering fashion generally cylindrical locator pins mounted on the other support portion of the fixture when that portion of the fixture and the portion of the fixture initially supporting the locator assembly are shifted toward each other and into their operative relationship. The alignment pin receiving, centering and gripping mechanisms are automatically actuated entirely in response to the movement of the alignment pins into the mechanisms as the two support portions of the fixture are relatively shifted into their operative relationship, so that all that is required in emplacing a locator assembly and a printed circuit board carried thereby into the fixture for commencement of a testing operation is for such locator assembly to be positioned in shiftable relationship to the surface of one of the support portions of the fixture with a limited degree of locational precision sufficient merely to assure that the alignment pins will enter the receiving and gripping mechanisms of the locator assembly, whereupon more precise positioning of the shiftable locator assembly and the printed circuit board carried thereby into a predetermined position for proper alignment with the contacts will automatically be accomplished through the centering action of the mechanisms themselves as the alignment pins penetrate such mechanisms more deeply during relative shifting of the support portions of the fixture into their operative relationship.

The improved alignment pin receiving, centering, and gripping mechanisms employ a cup member for receiving the end of a corresponding alignment pin and being axially shifted by movement of the latter, a plurality of centering and gripping balls variably penetrating the interior of the cup member through apertures in the side wall of the latter, and a tapered surface for engaging such balls for increasing the forceful penetration of the latter radially inwardly of the cup member as the latter is axially shifted relative to such tapered surface to ultimately grip and hold the alignment pin in axially centered relationship to the mechanism when such cooperating parts have been relatively moved toward each other to that full extent corresponding to the desired operative relationship between the two support portions of the fixture.

Significant further details of the improved apparatus will be hereinafter referred to and further explained in the course of description of the currently preferred embodiment of the invention shown in the drawings and described herein for illustrative purposes.

DESCRIPTION OF THE PREFERRED EMBODIMENT

Figure 1:
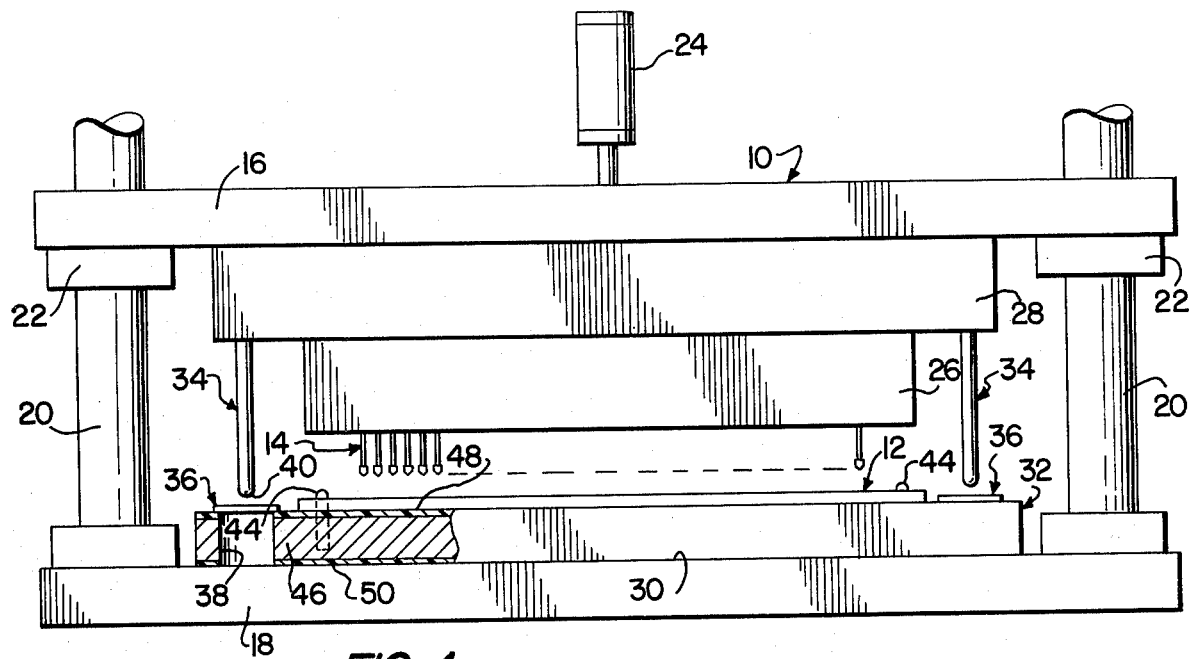
FIG. 1 is a somewhat schematic, side elevational view of an illustrative printed circuit board testing fixture showing the incorporation therein of our currently preferred embodiment of the invention, with a portion of the locator assembly being broken away and shown in cross-section.

The improved apparatus 10 contemplated by the invention is in the general nature of what is commonly referred to as a "testing fixture" for use in effecting temporary electrical connections between external electrical circuit testing equipment (not shown) and the multitudinous test point zones upon a face of a printed circuit board or analogous electrical device 12. The improvement involved in the invention relates primarily to the manner in which the device 12 to be tested is supported and positioned within the fixture 10 and the manner in which the device 12 is automatically aligned with an array of contacting assemblies 14 carried by the fixture 10 so as to assure precision engagement between each of the test point zones of the device 12 and a corresponding one of the contact assemblies 14 when the fixture 10 is operated for effecting the desired electrical connections with the device 12, as well as accomplishing that objective in an economical, reliable and otherwise practicable fashion that also facilitates the emplacement into and removal from the fixture 10 of devices 12 to be successively tested from the standpoint of both the time required and the convenience provided in carrying out the successive testing of a number of the devices 12.

Those skilled in the art will perceive, therefore, that, although the improved aspects of the fixture 10 most germane to the accomplishment of the mentioned objectives are disclosed herein with reference to the specific construction of our currently preferred embodiment thereof, other aspects of the over-all fixture 10, which may assume differing configurations in different installations, are intended to be understood as merely illustrative. Indeed, the precise details of construction of our currently preferred embodiment of the improved portions of the fixture 10 should also be understood by those skilled in the art as relatively illustrative in character, since it will be apparent that various minor modifications could be made or equivalent structures employed without departing from the essence of the improvement and while still enjoying its benefits at least to a substantial degree.

In the form of fixture 10 somewhat schematically depicted for illustration in FIG. 1, such apparatus will be seen to include an upper support or head assembly 16 and a lower support or platen assembly 18, with the head 16 mounted for reciprocation toward and away from the platen 18 by means of upstanding posts 20 secured to the platen 18 and bearing sleeves 22 secured to the head 16 and slideable along the posts 20. Suitable operating means 24, such as a manually controllable hydraulic or pneumatic piston assembly, is operably coupled with the head 16 for selectively moving the latter between a standby or loading position as indicated in FIG. 1 and a lowered testing position in which the head 16 and platen 18 are in an operative relationship for causing the contact assemblies 14 to engage the test point zone bearing face of the printed circuit board or other device 12 to be tested with appropriate force for effecting reliable electrical connections. The contact assemblies 14 are immediately carried by a board 26 typically formed of electrically insulative material, which in turn is supported by a mounting frame 28 secured to the head 16 in such manner that the distal extremities of the contact assemblies 14, which are substantially co-planar, will be in spaced, facing relationship with a substantially flat upper surface 30 upon the platen 18. Those skilled in the art will appreciate, however, that the improvements contemplated by this invention may also be incorporated into fixtures 10 in which the required relative shifting between the head 16 and the platen 18 is accomplished by moving the latter rather than the former, or by moving both of them, as well as in fixtures 10 wherein the means employed for accomplishing such relative shifting between the head 16 and the platen 18 or the details and orientation of such components of the fixture 10 may be quite different than those schematically depicted in FIG. 1 for illustrative purposes.

Figure 2:
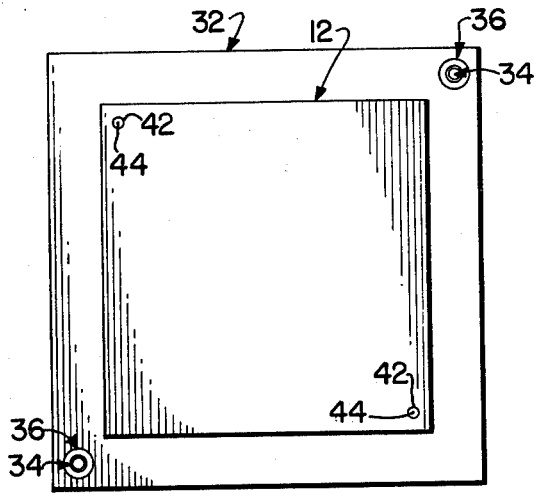
FIG. 2 is a top plan view of a typical printed circuit board device mounted upon a locator assembly constructed in accordance with this invention, with the details of the printed circuit paths and test point zones of the printed circuit board being omitted due to the impracticalities of illustrating a realistic example of same to the scale otherwise appropriate for showing those aspects of the board necessary for proper understanding of this invention and because the varying patterns which the printed circuit paths and test point zones can assume are already well known to those skilled in the art.

The improvements contemplated by the invention arise primarily from the incorporation into the fixture 10 of a device locator assembly 32, a plurality of position aligning locator pins, 34 and a corresponding plurality of mechanisms 36 for receiving the pins 34 in automatically centering relationship and for gripping such pins 34 to hold the latter in such centered relationship to the mechanisms 36. Those skilled in the art will perceive that the pins 34 and their corresponding mechanisms 36 each present an assembly of cooperating parts that will be effective to perform their intended functions even with a reversal of the respective mountings for the pins 34 and mechanisms 36 upon other parts of the fixture or apparatus 10. In our currently preferred construction, however, the pins 34 are rigidly mounted upon the mounting frame 28 and depend from the latter along axes substantially perpendicular to the plane of the surface 30 of the platen 18, while the mechanisms 36 are rigidly secured within corresponding holes 38 in the locator assembly 32. As best shown in FIG. 2, a pair of the mechanisms 36 disposed adjacent opposite corners of the locator assembly 36 is the preferred construction, with there similarly being a pair of the locator pins 34 mounted in corresponding positions upon the mounting frame 28. The pins 34 are elongate and preferably cylindrical, which reduces fabrication costs as compared with alignment pins requiring the machining of tight tolerance tapers, although the distal ends of the pins 34 are preferably somewhat rounded to facilitate entry into the mechanisms 36 in the manner subsequently described in greater detail.

As will be seen in FIG. 2, the printed circuit board devices 12 will themselves be conventionally provided with a pair of alignment holes 42 adjacent the opposite corners thereof, which fit over corresponding alignment pins 44 rigidly mounted on and protruding from the locator assembly 32, it being observed that the mechanisms 36 will preferably be located adjacent the corners of the locator assembly 32 along the diagonal opposite from that along which the holes 42 in the devices 12 to be tested are disposed.

The locator assembly 32 is preferably fabricated in laminated fashion having a central layer 46 formed of metal (preferably aluminum or the like to reduce weight) to permit the rigid mounting of the pins 44 and the mounting of the mechanisms 36 on the locator assembly 32 to be accomplished with high and lasting precision. Atop the layer 46 is a relatively thin layer 48 of electrically insulative material, such as a plate of the fiber glass board typically employed in manufacturing the printed circuit boards 12 themselves; such layer 48 provides electrical insulation between any electrically active areas that may exist on the lower face of the printed circuit board 12 from the preferably metallic layer 46 of the locator assembly 32. The bottom layer 50 in the preferred form of locator assembly 32 is a thin plate of suitable low-friction plastic (such as teflon), which is provided for the purpose of enhancing the freedom with which the locator assembly 32 can slide in any direction upon the surface 30 of the platen 18, upon which it freely rests. Those skilled in the art will appreciate that the amount of actual sliding movement of the locator assembly 32 upon the surface 30 that will typically be involved during final alignment between the mechanisms 36 and the locator pins 34 will be relatively small, but the over-all operation of the improved apparatus 10 will be enhanced by reducing the amount of friction resisting relative sliding movement of the locator assembly 32 upon the surface 30 of the platen 18 even when the amount of such movement required for the precision positioning of the locator assembly 32 in its predetermined position for proper alignment of the device 12 with the contact assemblies 14 is quite small.

Figure 3:
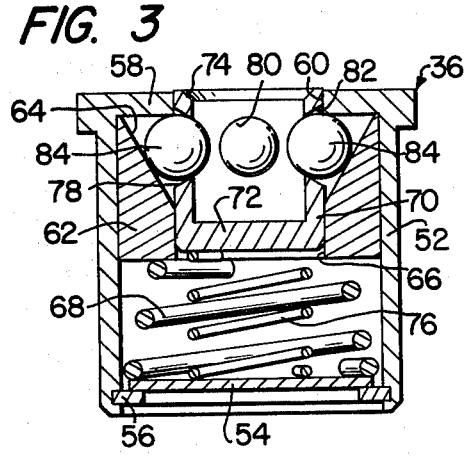
FIG. 3 is a central cross-sectional view of one of the alignment pin receiving, centering and gripping mechanisms, depicted in the standby condition thereof in which an alignment pin has not entered the mechanism.
Figure 4:
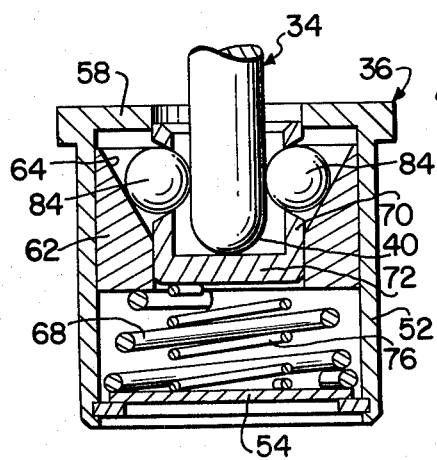
FIG. 4 is a cross-sectional view of one of such mechanisms similar to that of FIG. 3, but depicting the mechanism in a condition thereof in which an alignment pin has entered the mechanism and moved relative to the latter sufficiently for the mechanism to have centered and gripped the alignment pin.
Figure 5:
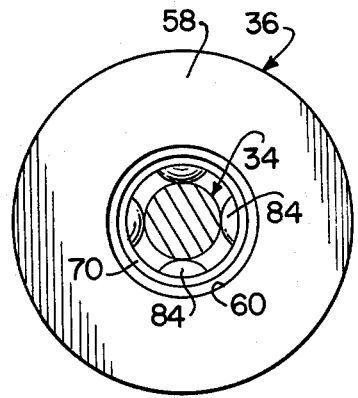
FIG. 5 is a top plan view of the mechanism shown in FIG. 5, with the alignment pin shown in cross-section, depicting the centered relationship of the alignment pin with respect to the axis of the mechanism by which the alignment pin is being held.

Referring next more particularly to FIGS. 3, 4 and 5, the construction of the mechanisms 36 and the manner in which they cooperate with the pins 34 in our currently preferred embodiment of the invention are illustrated in greater detail. Each mechanism 36 has a generally cylindrical housing 52 having an obstruction in the form of a plug plate 54 held by a retaining ring 56 at one end of the housing 52 and an end wall 58 provided with a centered circular opening 60 at the other end thereof. Slideably mounted within the housing 52 is an annular bushing 62 provided with a conical, tapered inner surface portion 64 and an inner bore surface 66. The bushing 62 is yieldably biased toward the end wall 58 by a compression spring 68 engaging the end of the bushing 62 facing the plug plate 54 and oppositely engaging the latter. A cylindrical cup member 70 having a bottom wall 72 at one end thereof and an open top 74 at the other end thereof is slideably mounted within the bore 66 of the bushing 62 and also slideably extends into the opening 60 of the wall 58 of the housing 52. The cup member 70 is yieldably biased in the direction of the opening 60 by a compression spring 76 oppositely engaging the bottom wall 72 of the cup member 70 and the plug plate 54. Thus, the bushing 62 and the cup member 70 are both yieldably biased in the same direction along their common axis by the springs 68 and 76, and the spring 68 is of heavier or stiffer construction than the spring 76 so that the cup member 70 will be more readily shiftable within the housing 52 than the bushing 62. The cup member 70 is provided around its circumferential wall with a plurality of equally spaced apertures 78, 80, 82, etc., which it will be noted taper down to a smaller diameter at the inner surface of the cup member 70 from the diameter at the outer surface of the latter. A ball 84 is provided for each of the apertures 78, 80, 82, etc., and the balls 84 are of a diameter to extend inwardly partially through their corresponding apertures, but not to pass entirely through such apertures.

The condition of the mechanism 36 depicted in FIG. 3 represents the normal or standby state thereof when the corresponding locator pin 34 is not penetrating into such mechanism 36. In that condition, the bushing 62 is fully biased toward the wall 58 by the spring 68, and the cup member 70 is biased by the spring 76 to an outer position limited by the opposite engagements of the balls 84 with the wall 58 and the bottoms of the corresponding apertures 78, 80, 82, etc. Although it may be difficult or impossible to observe from the drawings, because of the scale of the latter and the fact that only a relatively small amount of movement is involved, in such standby condition of the mechanism 36 the balls 84 are relatively loosely or yieldably protruding through the apertures 78, 80, 82, etc., rather than being interlockingly forced into a fully inwardly displaced position by the interengagements involved. In the currently preferred embodiment, the outer diameter of the main cylindrical portion of the mechanisms 36 is 1-inch, the diameters of the opening 60 and the bore 66 are $\frac{1}{2}$-inch, and the outer diameter of the cup member 70 is just very slightly less than $\frac{1}{2}$-inch to provide for a slip fit between the cup member 70 and the bushing 62. In the same embodiment, the balls 84 are approximately 0.22 inch or a little less, the diameter of the inner surface of the cup member 70 is $\frac{3}{8}$-inch, and the diameter of the pins 34 is $\frac{1}{4}$-inch. Accordingly, it will be understood that a portion of the locator pins 34 adjacent the distal end thereof may easily enter the cup member 70 of the corresponding mechanism 36 through the open end 74 thereof and will be initially urged, although yieldably, toward a position generally centered upon the axis of the cup member 70 by engagement with the balls 84 as the distal end of the pin 34 is moved into deeper penetrating relationship with the cup member 70 and toward the end wall 72 thereof.

FIGS. 4 and 5 depict the condition and relationship of the mechanisms 36 with their corresponding locator pins 34 when the head 16 and platen 18 have been relatively moved into their operative relationship for effecting the electrical connections between the contact assemblies 14 and the test point zones of the printed circuit board 12 required for testing of the latter. In this condition, it will be noted that the distal end of the locator pin 34 has not only engaged the wall 72 of the cup member 70, but has forced the latter downwardly relative to the housing 52 against the yieldable biasing action of the spring 76. As the cup member 70 commenced to move downwardly under the influence of the engagement of its wall 72 by the pin 34, the apertures 78, 80, 82, etc., carried the balls 84 downwardly, and specifically moved the same downwardly relative to the tapered surface 64 of the bushing 62, during which the action of the incline of the tapered surface 64 upon the balls 84 forced each of the latter radially inwardly toward the pin 34 to accurately center the same and to provide an initial gripping action thereupon. Once the balls 84 have thus reached a condition locking the same in a fully inwardly penetrating position, by virtue of the engagements between the balls 84 with the tapered surface 64, the circumferential surface of the pin 34 and the defining surfaces of the apertures 78, 80, 82, etc., (particularly at the top of the latter), further movement of the pin 34 into the mechanism 36 will also somewhat downwardly displace the bushing 62 against the stronger biasing action of the spring 68, which assures that the inclined surface 64 will move the balls 84 inwardly into maximum force engagement with the pin 34 for tightly gripping and holding the latter in a centered position relative to the axis of the mechanism 36. The yieldable biasing of the bushing 62, as opposed to rigid mounting thereof upon the housing 52, also incidentally provides tolerance for the exact extent to which the locator pin 34 may penetrate into the mechanism 36, so as to prevent breakage within the latter due to possible small variations in the longitudinal movement of the locator pins 34.

It should be understood that, although only a single locator assembly 32 will be positioned within the fixture 10 during the testing of the particular printed circuit board device 12 mounted thereon, the advantages of the invention may be most fully enjoyed in a practical sense by the provision of a plurality of interchangeable locator assemblies 32 intended for successive insertion into the fixture 10. Such locator assemblies, at least in reasonable numbers, are relatively inexpensive to fabricate, and, if several of same are provided, it will be apparent that, during testing of one printed circuit board device 12, other similar devices 12 may be mounted upon auxiliary locator assemblies 32 outside of the fixture 10 itself by merely emplacing such further devices 12 to be successively tested upon such auxiliary locator assemblies 32 with the alignment pins 44 of the latter passing through the holes 42 of the devices. Then, when the testing of the particular device 12 already within the fixture 10 has been completed, it and the locator assembly 32 upon which it is mounted may be removed from the fixture 10 as a unit and another auxiliary locator assembly 32 already having the next device 12 to be tested mounted thereon, may be inserted into the fixture 10, with the previously tested device 12 then being conventionally removable from the locator assembly 32 upon which it was mounted during testing to ready the latter for mounting of another, as yet untested device 12 thereon. An alternative mode of use, of course, would be to substitute successive devices 12 to be tested upon a single locator assembly 32, perhaps, without fully removing the locator assembly 32 from the fixture 10; however, the provision and use of additional, interchangeable locator assemblies 32 will expedite the overall testing process where any significant number of devices 12 are required to be successively tested.

Although it is believed that the operation of the apparatus 10 will be apparent to those skilled in the art from what has already been herein mentioned with respect to particular aspects of such apparatus 10, the steps involved may be briefly summarized as follows. With the operating means 24 actuated to move the head 16 to its standby position displaced away from the platen 18, a locator assembly 32 is emplaced within the fixture 10 in resting relationship upon the surface 30 of the platen 18 and in approximately the desired position into which the locator assembly 32 will need to be positioned for reliable testing. The printed circuit board device 12 will preferably already have been mounted upon the locator assembly 32 prior to insertion of the latter into the fixture 10, although with less efficiency it would be possible to first emplace the locator assembly 32 and then mount the device 12 to be tested thereon with the locator assembly 32 already at least partially within the fixture 10. The automatic centering action accomplished by the mechanisms 36 requires that the locator assembly 32 be initially positioned by the operator upon the surface 30 only with sufficient precision to assure that the locator pins 34 will enter the opening 74 in the cup member 70 of the mechanisms 36, and it normally will be helpful in achieving an adequate degree of accuracy of such initial emplacement of the locator assembly 32 to provide guide markings or the like upon the surface 30 of the platen 18. With the locator assembly 32 and the device 12 to be tested that is carried thereby being thus approximately positioned within the fixture 10, the operator may actuate the operating means 24 to move the head 16 toward the platen 18 and the desired operative relationship thereof. As the locator pins 34 enter the open end 74 of the cup member 70 of the mechanisms 36 and progress more deeply into the mechanisms 36, the latter will function in the manner already described in some detail to accomplish centered alignment between each mechanism 36 and the corresponding locator pin 34, as well as tight gripping of the latter by the mechanism 36 to hold the same in such centered and aligned relationship. During such centering action, it will be observed that the locator pins 34, being rigid and securely mounted upon the mounting frame 28, do not move laterally, and that it is actually the mechanisms 36 that move laterally as required to accommodate to the mentioned centering action. Although the amount of lateral movement of the mechanisms 36 typically required may be quite small, that extent of movement of the mechanisms 36 that may be required for proper centering in each given instance is critical to the accomplishment of the precise positioning of the locator assembly 32 and the device 12 carried thereby in precisely the location required for proper aligned engagement of the contact assemblies 14 with the test point zones of the device 12. As the head 16 and platen 18 move into their operative relationship, each of the test point zones of the device 12 is properly engaged by a corresponding contact assembly 14 to effect the desired electrical coupling therebetween, it being noted that the contact assemblies 14 will normally be of the spring pin type to assure proper engagement pressure thereof upon the corresponding test point zone without the exertion of undue force. With such electrical connections between the contact assemblies 14 and the test point zones of the device 12 thus effected, the external electrical circuitry testing equipment may proceed with the desired tests, it being understood that such testing equipment will be electrically coupled with the contact assemblies 14 by lead wires or the like (not shown). Once the desired electrical testing has been completed, the operator may then actuate the operating means 24 to displace the head 16 away from the platen 18 and, in the course thereof, both withdrawing the contact assemblies 14 away from the device 12 and withdrawing the locator pins 34 from the corresponding centering and gripping mechanisms 36. In this condition, the locator assembly 32 and tested device 12 thereon may be removed from the fixture 10 and a similar assemblage including the next device 12 to be tested inserted into the fixture 10 for repetition of the cycle described (or, if desired, with the head 16 displaced away from the platen 18, the tested device 12 could be removed from the locator assembly 32 already within the fixture 10 and the next device 12 to be tested emplaced upon such locator assembly 32).

As previously noted, it will be apparent to those skilled in the art that various modifications could be made or equivalent constructions employed, with respect to those employed in our currently preferred embodiment of the invention, without materially departing from the essence of the improvement accomplished by the invention. Accordingly, it is to be understood that the invention should be regarded as of the nature and scope defined by the claims which follow, and that such claims should be deemed to include equivalent, modified forms of the apparatus hereinabove described for illustrative purposes with reference to our currently preferred embodiment.

I claim:

1. In apparatus for use in effecting temporary electrical connections with multiple test point zones of each of a succession of printed circuit board devices:

a pair of relatively shiftable support means,
one of said support means being provided with a substantially flat surface;
means for relatively shifting said support means between a relatively more widely spaced relationship and a relatively more closely spaced relationship along a path of relative shifting that is substantially perpendicular to said surface as said closely spaced relationship is approached;
shiftable locator assembly means engaging and slidably supported by said surface for free movement in any direction across the latter when said support means are in said widely spaced relationship;
means adapted for mounting a printed circuit board device in a fixed position upon said locator assembly means with said test point zones of said device in facing relationship to a portion of the other of said support means when said support means are in said closely spaced relationship;
a plurality of contact means mounted on said portion of said other support means and positioned for respectively engaging corresponding test point zones of a printed circuit board device so mounted on said locator assembly means when the latter is in said predetermined operative position along said surface and said support means are in said closely spaced relationship; and
aligning means having a pair of cooperating assemblies respectively mounted on said other support means and on said locator assembly means, said cooperating assemblies being disengaged from each other when said support means are in said widely spaced relationship but being interengaged with each other as said support means are relatively shifted into said closely spaced relationship to shift and hold said locator assembly means in said predetermined operative position, whereby proper alignment between said contact means and the test point zones of said printed circuit board device mounted on said locator assembly means is assured.

2. In apparatus as set forth in claim 1, wherein:
said cooperating assemblies of said aligning means are configured to move into a predetermined, self-centering alignment therebetween as said cooperating assemblies are shifted toward each other and become interengaged during relative shifting of said support means into said closely spaced relationship.

3. In the apparatus of claim 1, wherein:

one of said cooperating assemblies of said aligning means includes an elongate alignment pin means, and the other of said cooperating assemblies includes mechanism provided with a cavity for receiving a distal portion of said pin means.

4. In apparatus as set forth in claim 3, wherein:

said mechanism includes a shiftable member in which said cavity is formed that is engagable and shiftable by said pin means when said support means are relatively shifted into said closely spaced relationship, a shiftable element movable radially into tight engagement with said distal portion of said pin means in response to said shifting of said member by said pin means.

5. In apparatus as set forth in claim 3, wherein said mechanism comprises:

a housing having an opening in one extremity thereof:

an open-ended cup member mounted in said housing for movement toward the other extremity of said housing along a path parallel to the central axis of said opening of said housing, said cup member having an end wall opposite the open end thereof engageable by said pin means, and side wall means provided with a plurality of aperatures therein;

ball means within said housing partially extending through said apertures and shiftable inwardly and outwardly with respect to said side wall means of said cup member and thereby into and out of engagement with said pin means;

bushing means shiftably mounted within said housing for movement parallel to said axis, said bushing means having a bore for slideably receiving a portion of said side wall means of said cup member adjacent said bottom wall of the latter and a tapered inner surface disposed for engaging said ball means for moving the latter inwardly when said cup member is shifted relative to said bushing means along said axis in the direction away from said opening of said housing;

means for yieldably biasing said bushing means toward the extremity of said housing provided with said opening; and means for yieldably biasing said cup member toward the the end of said housing provided with said opening.

6. In apparatus as set forth in claim 5, wherein:

said yieldable biasing means comprise compression springs, and said compression springs associated with said bushing means is stiffer than said compression spring associated with said cup member.

* * * * *